United States Patent
Thompson

(10) Patent No.: US 8,269,248 B2
(45) Date of Patent: Sep. 18, 2012

(54) LIGHT EMITTING ASSEMBLIES AND PORTIONS THEREOF

(76) Inventor: Joseph B. Thompson, Gulf Shores, AL (US)

(*) Notice: Subject to any disclaimer, the term of this patent is extended or adjusted under 35 U.S.C. 154(b) by 57 days.

(21) Appl. No.: 12/561,955

(22) Filed: Sep. 17, 2009

(65) Prior Publication Data

US 2010/0314655 A1    Dec. 16, 2010

Related U.S. Application Data

(63) Continuation of application No. 12/396,460, filed on Mar. 2, 2009, now abandoned.

(51) Int. Cl.
H01L 29/22 (2006.01)
H01L 33/00 (2010.01)
H01L 23/495 (2006.01)
H01L 23/10 (2006.01)
H01L 23/34 (2006.01)
H01L 23/28 (2006.01)

(52) U.S. Cl. .......... 257/99; 257/675; 257/706; 257/707; 257/717; 257/718; 257/720; 257/796; 257/E23.101; 257/E23.103; 257/E23.105; 257/E33.056; 257/E33.057; 257/E33.058; 257/E33.075

(58) Field of Classification Search .......... 257/675, 257/706, 707, 717, 718, 720, 796, E23.101, 257/E23.103, E23.105
See application file for complete search history.

(56) References Cited

U.S. PATENT DOCUMENTS

| | | | | |
|---|---|---|---|---|
| 5,105,259 A | * | 4/1992 | McShane et al. | 257/667 |
| 5,147,821 A | * | 9/1992 | McShane et al. | 264/272.17 |
| 5,644,163 A | * | 7/1997 | Tsuji | 257/706 |
| 6,033,787 A | * | 3/2000 | Nagase et al. | 428/545 |
| 6,260,613 B1 | * | 7/2001 | Pollard, II | 165/185 |
| 6,516,516 B1 | * | 2/2003 | Lee | 29/855 |
| 6,517,218 B2 | * | 2/2003 | Hochstein | 362/294 |
| 7,138,667 B2 | * | 11/2006 | Barnett et al. | 257/99 |
| 7,244,965 B2 | * | 7/2007 | Andrews et al. | 257/98 |
| 7,456,499 B2 | * | 11/2008 | Loh et al. | 257/710 |
| 7,494,250 B2 | * | 2/2009 | Chen | 362/294 |
| 7,625,104 B2 | * | 12/2009 | Zhang et al. | 362/294 |
| 7,629,537 B2 | * | 12/2009 | Ice | 174/254 |
| 7,633,093 B2 | * | 12/2009 | Blonder et al. | 257/81 |
| 7,675,086 B2 | * | 3/2010 | Ku | 257/99 |
| 7,728,341 B2 | * | 6/2010 | Mazzochette et al. | 257/98 |
| 7,736,044 B2 | * | 6/2010 | Chew et al. | 362/612 |
| 7,737,463 B2 | * | 6/2010 | Lee et al. | 257/99 |
| 7,855,395 B2 | * | 12/2010 | Lee et al. | 257/99 |

(Continued)

FOREIGN PATENT DOCUMENTS

JP          10190176 A     *     7/1998

*Primary Examiner* — Ida M Soward

(74) *Attorney, Agent, or Firm* — Miele Law Group PC

(57) ABSTRACT

Apparatus may be provided including a high power light emitting diode (LED) unit, at least one printed circuit board, and an interfacing portion of a heat sink structure. The high power LED unit includes at least one LED die, at least one first lead and at least one second lead, and a heat sink interface. The at least one printed circuit board includes a conductive pattern configured to connect both the at least one first lead and the at least one second lead to a current source. The interfacing portion of the heat sink structure is that portion through which a majority of heat of the heat sink interface is transmitted. The interfacing portion is directly in touching contact with a majority of a heat transfer area of the heat sink interface.

14 Claims, 11 Drawing Sheets

U.S. PATENT DOCUMENTS

| | | | |
|---|---|---|---|
| 7,863,639 B2 * | 1/2011 | Yen | 257/99 |
| 7,901,113 B2 * | 3/2011 | Kim et al. | 362/328 |
| 7,906,794 B2 * | 3/2011 | Harrah et al. | 257/99 |
| 7,911,059 B2 * | 3/2011 | Cheng et al. | 257/758 |
| 8,044,418 B2 * | 10/2011 | Loh et al. | 257/98 |
| 2002/0012230 A1 * | 1/2002 | Oishi et al. | 361/704 |
| 2006/0018120 A1 * | 1/2006 | Linehan et al. | 362/247 |
| 2006/0226435 A1 * | 10/2006 | Mok et al. | 257/98 |
| 2007/0069219 A1 * | 3/2007 | Lin et al. | 257/79 |
| 2007/0070530 A1 * | 3/2007 | Seo et al. | 359/819 |
| 2008/0019103 A1 * | 1/2008 | Kim | 361/720 |
| 2008/0089072 A1 * | 4/2008 | Kim et al. | 362/294 |
| 2009/0050908 A1 * | 2/2009 | Yuan et al. | 257/88 |
| 2009/0197360 A1 * | 8/2009 | Han et al. | 438/26 |
| 2009/0283781 A1 * | 11/2009 | Chan et al. | 257/89 |
| 2010/0046221 A1 * | 2/2010 | Posselt et al. | 362/249.02 |
| 2010/0059786 A1 * | 3/2010 | Lin et al. | 257/99 |
| 2010/0244060 A1 * | 9/2010 | Lee et al. | 257/88 |
| 2010/0252306 A1 * | 10/2010 | Mirsky et al. | 174/252 |
| 2010/0320499 A1 * | 12/2010 | Catalano et al. | 257/99 |

* cited by examiner

LIGHT EMITTING ASSEMBLIES AND PORTIONS THEREOF

RELATED APPLICATION DATA

This application is a continuation of U.S. application Ser. No. 12/396,460, filed Mar. 2, 2009 now abandoned, the content of which is hereby expressly incorporated by reference herein it its entirety.

FIELD OF DISCLOSURE

The present disclosure relates to high power light emitting diodes assemblies including high power light emitting diodes, and portions of such assemblies.

BACKGROUND

Traditional illumination technologies, for example, incandescent and fluorescent lighting, are being supplanted by high power light emitting diode structures. Light emitting diodes (LED's) have advantages over other illumination devices because they consume less power and last longer. In addition, they are highly durable, and responsive. One problem associated with high power LED's is the need to prevent the temperature in the LED die from rising. If the temperature of the LED die is allowed to rise above a certain threshold level, the life of the LED can be shortened. Moreover, the lighting efficiency would be compromised.

Another issue concerning LED lighting is the manufacturing cost. LED lighting solutions can cost substantially more than incandescent and fluorescent lighting solutions. Accordingly, there is a need for new technologies that reduce or prevent heat unwanted rises in temperature at the LED die, and that allow for LED's to be employed in various illumination setting at reduced manufacturing and deployment costs.

SUMMARY OF THE DISCLOSURE

In accordance with select embodiments described herein, apparatus may be provided. The apparatus may include a particular device, an assembly of devices, a single apparatus, or plural apparatus. The apparatus may include a high power light emitting diode (LED) unit, a least one printed circuit board, and an interfacing portion of a heat sink structure. The high power LED unit includes at least one LED die, at least one first lead and at least one second lead, and a heat sink interface. The at least one printed circuit board may include a conductive pattern configured to connect both the at least one first lead and the at least one second lead to a current source. The interfacing portion of the heat sink structure is the portion through which a majority of heat of the heat sink interface is transmitted. The interfacing portion is directly in touch contact with a majority of heat transfer area of the heat sink interface.

BRIEF DESCRIPTION OF THE DRAWINGS

Embodiments of the disclosure are further described in the detailed description which follows by reference to the noted drawings, in which like reference numerals represents similar parts throughout the several views of the drawings, and wherein.

DETAILED DESCRIPTION

Figure 1:
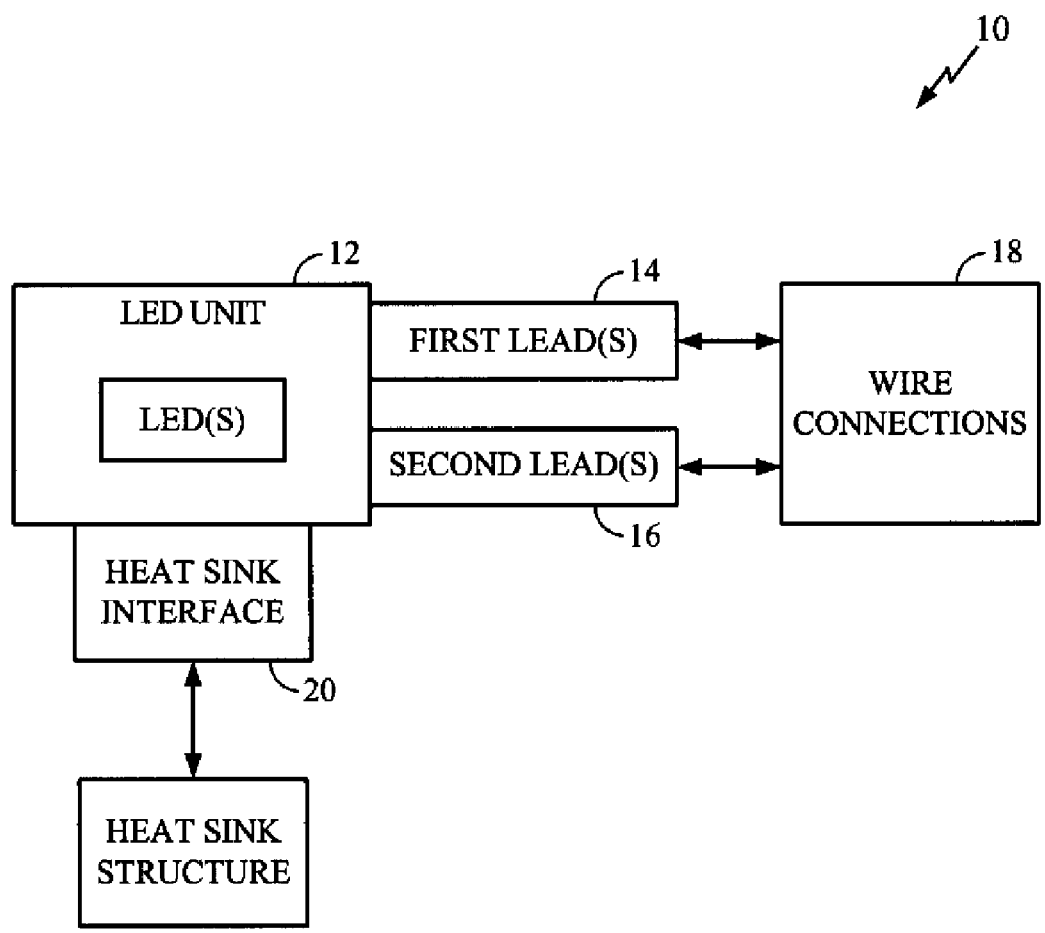
FIG. 1 is a block diagram of an illumination apparatus 10 in accordance with one embodiment herein.

Referring to the drawings now in greater detail, FIG. 1 is a block diagram of illumination apparatus 10. The illustrated apparatus 10 may include a single apparatus, plural apparatus, or an assembly of different devices. The illustrated apparatus 10 includes an LED unit 12, which includes one or more first leads 14, one or more second leads 16 and a heat sink interface 20. The illumination apparatus 10 further includes wire connections 18 and a heat sink structure 22. LED unit 12 may include a single LED die, or a plural set of LED dies. Alternatively, LED unit 12 may include a plural set of LEDs that all form part of one integrated circuit. LED unit 12 may further include a lens (not shown in FIG. 1) over its LED's.

Heat sink interface 20 could be provided on the bottom, top, and/or side of an LED module structure, or it could be provided on more than one of the bottom, top, and each of the four sides of a rectangular LED modular unit. The heat sink interface 20 could have an interfacing portion that is across the entire surface of a given side (among the bottom, top, and side sides) of LED unit 12, and this surface area could be considered the heat transfer area of the heat sink interface. Alternatively, the heat transfer area of the heat sink interface 20 could be a limited region on a given side (among the bottom, top, and side sides). Heat sink structure 22 may include, among other elements, radiated fins, metallic or ceramic structures that have a low thermal resistance, a heat transfer plate or structure, and so on. The material of the heat sink components could include any one or more of aluminum, copper, a different metal element or alloy, or a non-metallic substance suitable for a heat sink, e.g., ceramic.

Wire connections 18 include wire connections to one or more operating current sources which connect the at least one first lead 14 and at least one second lead 16 to such operating current or currents. In accordance with select embodiments herein, wire connections 18 are implemented in the form of conductors in a printed circuit board or a flex circuit.

Figure 3:
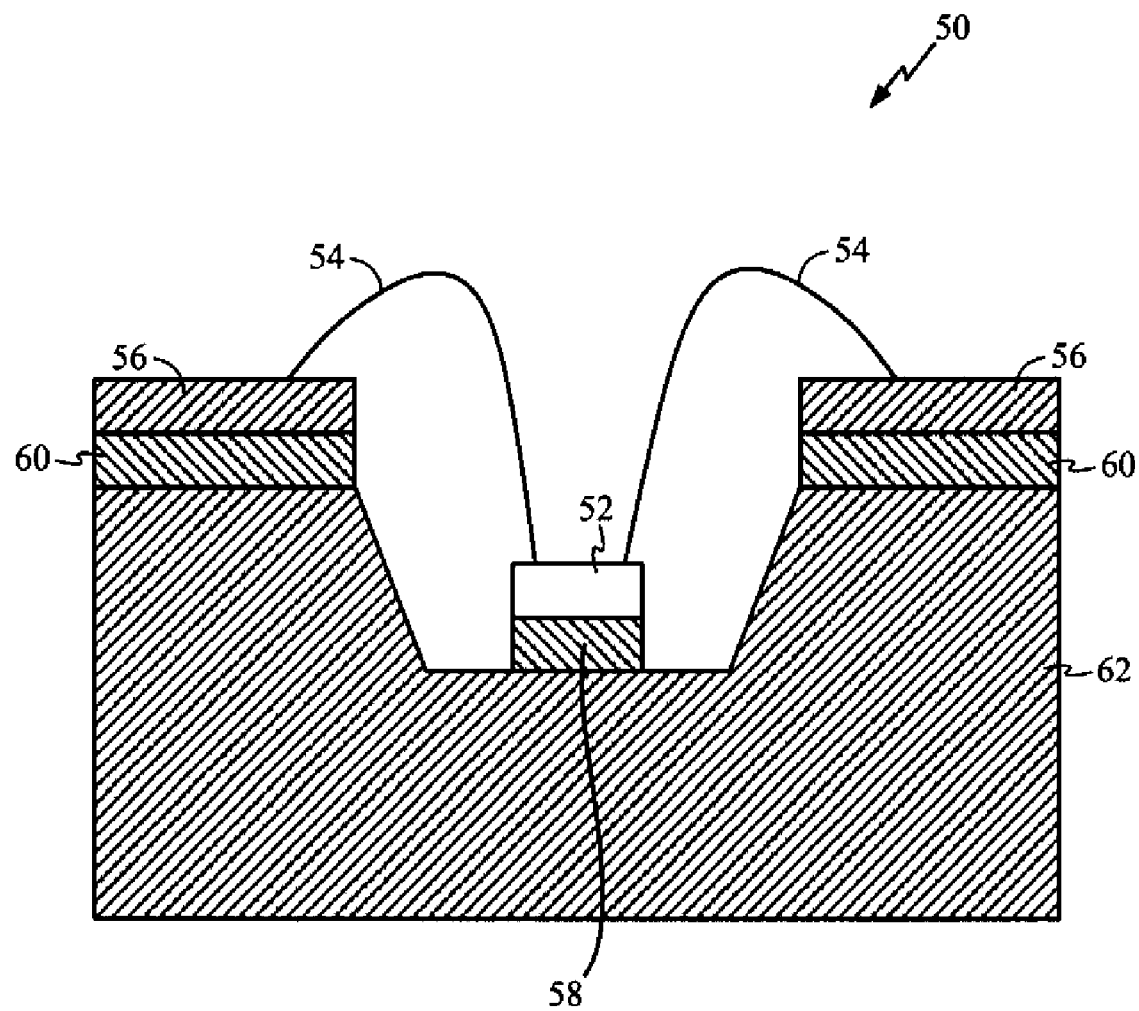
FIG. 3 is an elevated cross-sectional view of a panel type LED module.
Figure 4:
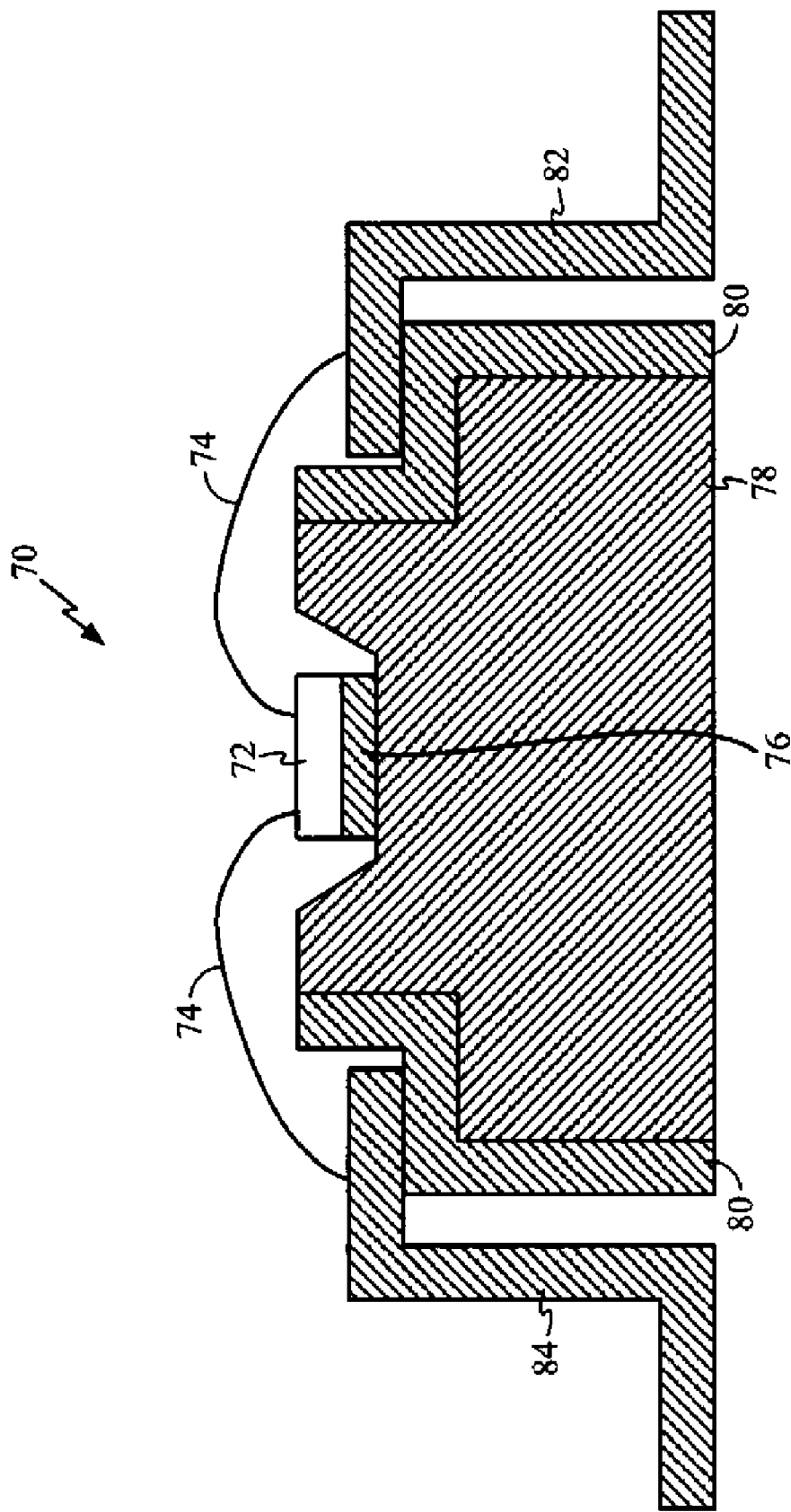
FIG. 4 is an elevated cross-sectional view of a surface mount LED module.

LED unit 12 could include one or more LED's interconnected in the form of an integral unit. Some examples of the types of LED's that could be included in LED unit 12 are shown in FIGS. 2, 3, and 4.

Figure 2:
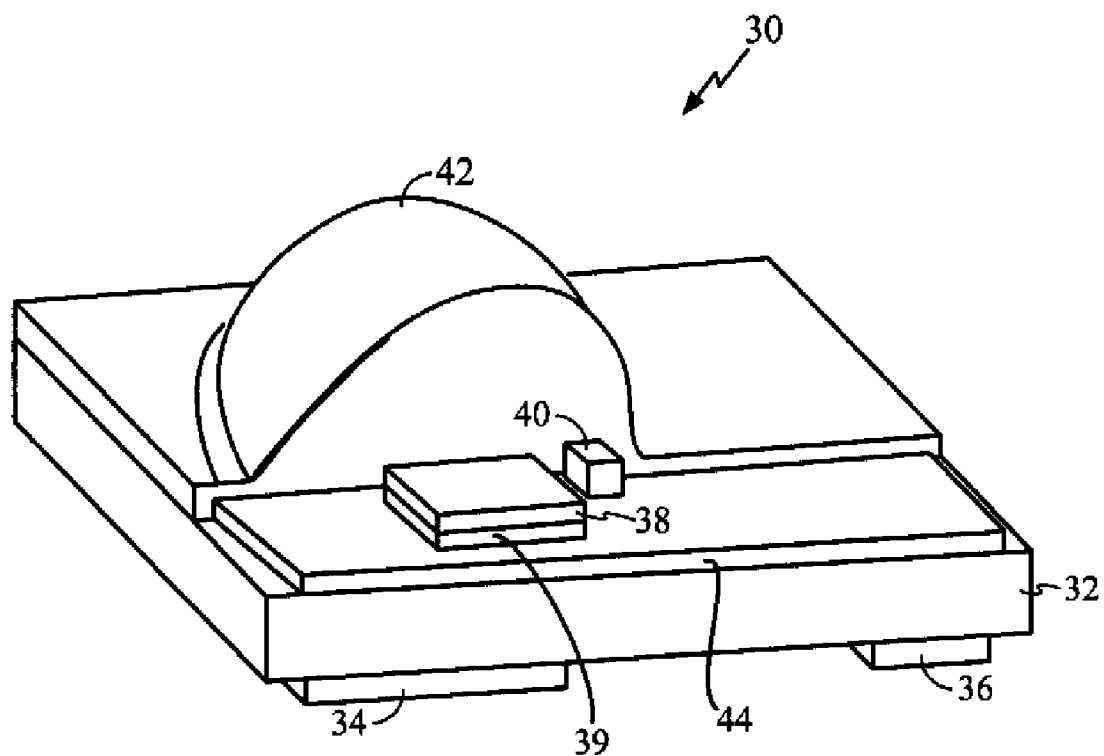
FIG. 2 shows an elevated perspective view of a cross section of a LUXEON® Rebel high power surface mount LED.

FIG. 2 is a perspective view of a cross section of a LUXEON® Rebel, a high power surface mount LED which is made by Philips. A version of the drawing in FIG. 2 is provided at page 12 of the Application Brief AB32, dated March 2007, provided by Philips (pages 1-13).

The illustrated cross-sectional portion of an LED module shown in FIG. 2 includes a cross section 30 with cut-away portions of a commercially available high power surface mount LED for illumination applications. The illustrated cut-away portions include a substrate 32, a thermal pad 34, a cathode 36 (an anode, not shown in this figure), an LED die 38, a bond layer 39, a TVS (transient voltage suppressor) 40, an integral lens 42, and an interconnect layer 44.

The substrate 32 is ceramic. The thermal pad 34 is electrically isolated from cathode 36 and the anode (not shown). The illustrated surface mount LED 30 includes a single LED die 38. Bond layer 39 is provided to secure LED die 38 to a metal interconnect layer 44, with a low thermal resistance bonding material. Integral lens 42 is made of silicon.

High power surface mount LED's such as that shown in FIG. 2 may be automatically installed using automated pick-and-place equipment and processes.

Figure 5:
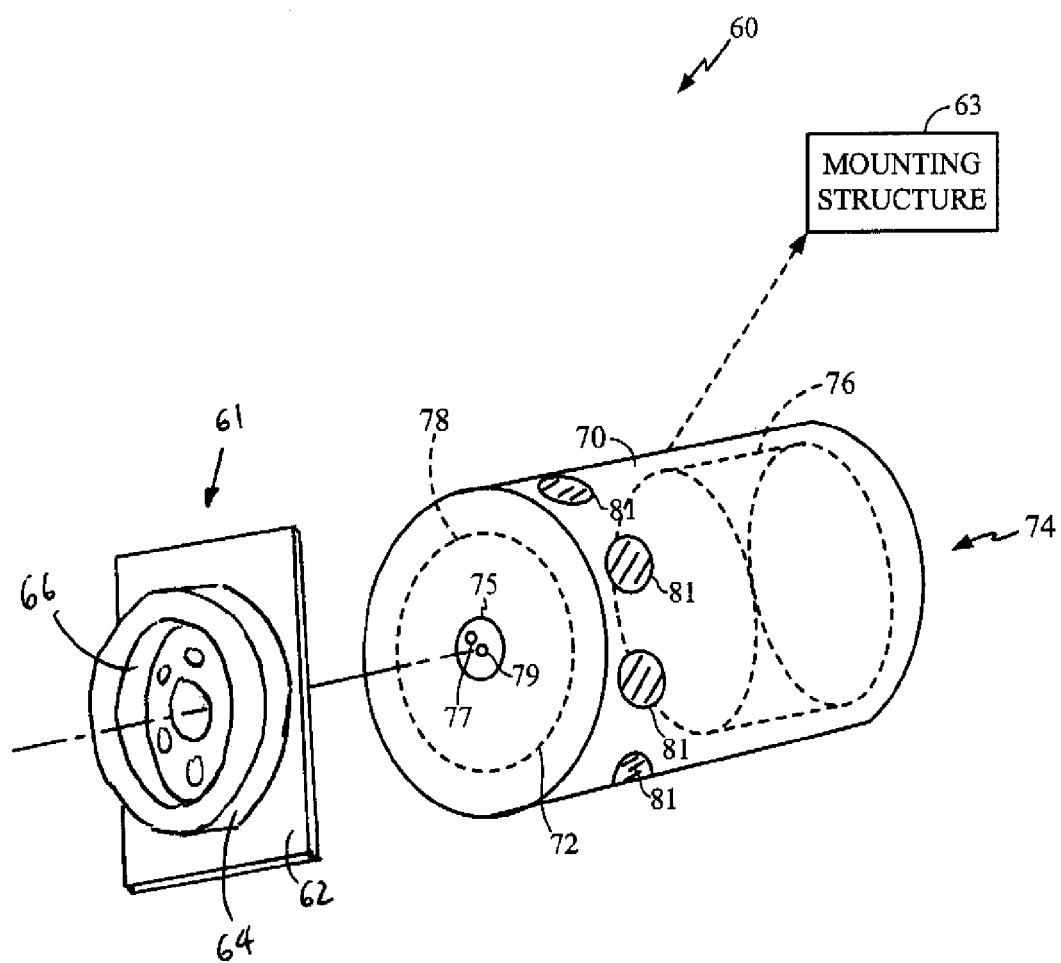
FIG. 5 is a perspective elevated view of an LED assembly in accordance with one embodiment of the present disclosure.

Philips provides a recommended pad layout and PCB (printed circuit board) design for the surface mount LED shown in FIG. 5, in the above-identified Application Brief AB32. LED module 30 may be fixed to a printed circuit board using a lead free reflow technique. Meanwhile, the printed circuit board (PCB) is connected to the thermal pad 34 of the surface mount LED 30 with plated-through-vias in order to reduce the thermal resistance of the assembly.

FIG. 3 is a cross-sectional elevated side view of a panel-type LED module 50. The illustrated LED module 50 includes one or more LED dies 52, each of which is connected to a conductive pattern on printed circuit boards portions 56. An illustrated LED die 52 is connected a metal substrate 62 via a thermally conductive adhesive 58.

This LED module 50 is described in U.S. Pat. No. 7,494,250, for example, at column 1 thereof. As described in the '250 patent, the thermally conductive adhesive 58 includes a silver epoxy that conducts heat. As shown in FIG. 3, an insulation colloid 60 is provided to electrically isolate metal substrate 62 from printed circuit board 56. The illustrated LED module 50 shown in FIG. 3 further includes wires 54 which connect the anode and cathode of LED die 52 to corresponding conductive portions of printed circuit board 56.

FIG. 4 is an elevated side cross sectional view of a surface mount LED module 70. This structure is also described in the '250 patent. The surface mount LED module 70 includes one or more LED dies 72. Each die 72 is connected to a bearing base 78 via a thermally conductive adhesive 76. This illustrated module 70 is also described in the '250 patent, which explains that thermally conductive adhesive 76 includes a silver epoxy.

The illustrated bearing base 78 is bordered around its periphery by an insulation housing 80. First and second lead frames 82 and 84 are provided which are connected to insulation housing 80. Wires 74 connect the anode and cathode respectively to the first and second lead frames 82 and 84.

FIG. 5 is a perspective view of an LED assembly 60 including an LED module 61 and a LED support and heat sink housing 70. LED module 61 may be secured to LED support and heat sink housing 70, for example, with the use of an adhesive, or with the use of a magnetic snap-on force created with the use of magnetic and ferrous components, to be described further hereinbelow.

The illustrated LED module 61 includes a heat spreader substrate 62, a cylindrical wall 64, and a transparent lens 66. A plurality of LED modules are mounted to heat spreader substrate 62 and are housed behind transparent lens 64 inside of cylindrical wall 64.

Heat spreader substrate 62, in the illustrated embodiment, includes a copper plate. Cylindrical wall 64 may be metallic. In one embodiment, cylindrical wall 64 includes a magnetic ring. Transparent lens 66 is secured to cylindrical wall 64 with the use of an adhesive. Cylindrical wall 64 is similarly secured to heat spreader substrate 62 with the use of an adhesive. LED support and heat sink housing 70, as shown in FIG. 5, may be cup-shaped. In the illustrated embodiment, LED support and heat sink housing 70 is metallic. It may be, for example, aluminum, a ferrous material, or copper.

Heat spreader substrate 62 and cup-shaped LED support and heat sink 70, when secured to each other, collectively serve as a heat sink structure. As a further part of the heat sink structure, a heat transfer structure 76 may be inserted inside the cylindrical opening of cup-shaped LED support and heat sink housing 70. Heat transfer structure 76 may include, for example, a piece of mass-produced honeycomb aluminum cut into a desired cylindrical shape and inserted into the cup-shaped housing 70 so that the longitudinal axes of the hexagonal cells of the honeycomb structure are parallel to the longitudinal axis of cup-shaped LED support and heat sink housing 70.

In the illustrated embodiment, the honeycomb heat transfer structure is cylindrical in shape, is in direct contact with the inner cylindrical walls of housing 70, and has a length, in the longitudinal direction of housing 70, that is about one third of the length of housing 70. In the illustrated embodiment, housing 70 has a diameter of about one and a quarter inches and a length of about two inches.

Housing 70 includes a base end 72, which is the end approximate to LED module 61. Housing 70 further includes an open end 74 which is at the end that is furthest from LED module 61.

In the event that housing 70 is made of a non-ferrous material, for example, aluminum, a ferrous member 78 may be secured or fixed behind base end 72, so that a magnet that is part of LED module 61 can exert an attractive biasing force acting on ferrous member 78, causing the interfacing portion of LED module 61 (heat spreader substrate 62) and the heat transfer area of the heat sink interface (i.e., base end 72) to be forced with continuous pressure to remain touching contact with each other. In different embodiments, different elements may be ferrous but not magnetized while others may be magnetized—in a manner to cause the same attractive biasing force noted above.

This magnetic connection force further causes a conductive pattern exposed underneath substrate 62 (not shown in FIG. 5) to come into contact with pin connectors 77 and 79 which in turn are connected to wires that connect the LED circuitry of LED module 61 with an operating current source. In the illustrated embodiment, outer pin connector 77 is put in contact with an annular conductive pad and inner pin connector 79 is put in contact with a conductive pad centered within and concentric with the annular conductive pad.

Housing 70 may include a plurality of holes 81 throughout the cylindrical wall thereof. This allows for air to pass into the cavity of cup-shaped housing 70 through holes 81, as well as through the openings within heat transfer structure 76 and the open end 74 of housing 70.

The illustrated housing 70 may be provided with a mounting structure 63 for purposes of mounting the resulting LED assembly 60 to some lighting fixture or in some other illumination application.

Figure 6:
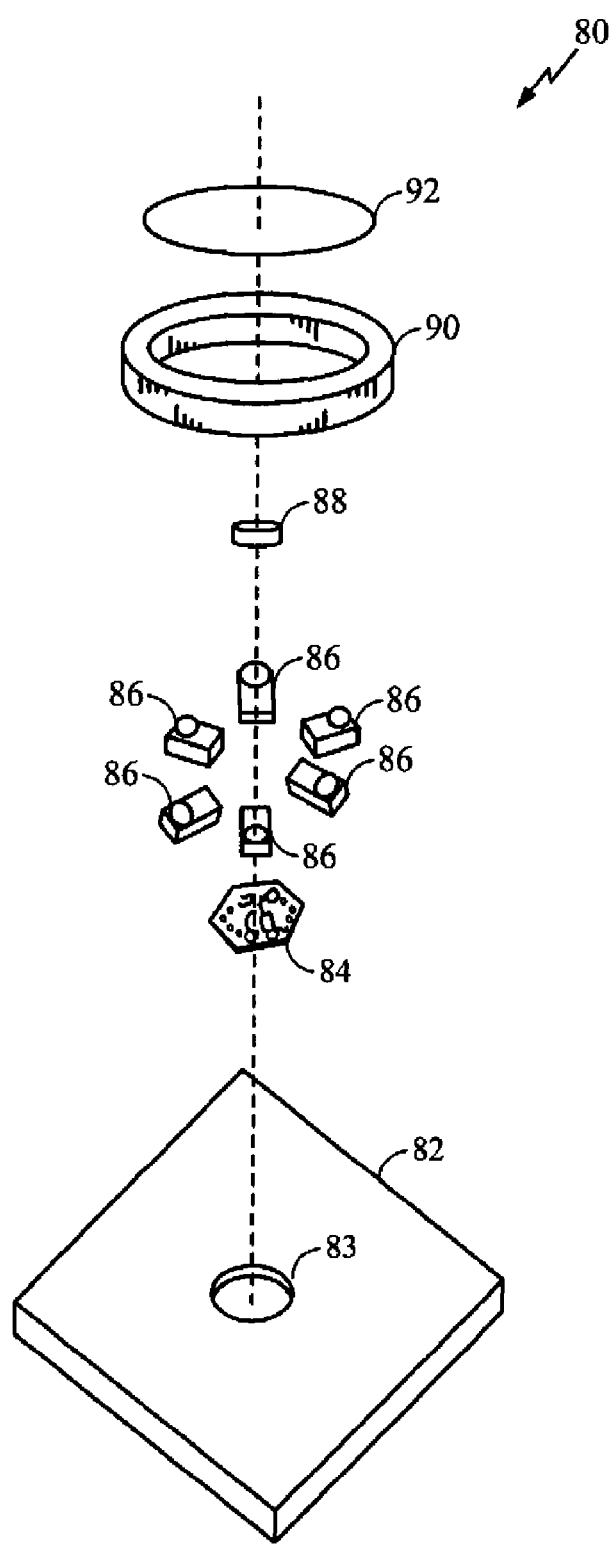
FIG. 6 is an exploded view of the LED module portion of the assembly shown in FIG. 5.

FIG. 6 is an exploded view of the elements of the LED module 61 shown in FIG. 5. The illustrated LED module 80 as shown in FIG. 6 includes a heat spreader substrate 82 (a copper plate having a hole 83, in the illustrated embodiment), a printed circuit board 84 (for example, a flex circuit as shown in the illustrated embodiment), a plurality of single die LED units 86, a small cylindrical magnet 88, a cylindrical wall or ring member 90, and a protective transparent lens 92.

PCB 84 is secured over an opening 83 of heat spreader substrate 82, when each of the six illustrated single LED units 86 is soldered to PCB 84 (at their anode and cathode pads) and soldered directly to the top surface of heat spreader substrate 82 (at their thermal pads).

Each of single die LED units 86 includes, on the lower surface thereof, a thermal pad, an anode lead, and a cathode lead. The anode and cathode leads are soldered to corresponding conductive pads on PCB 84, while the thermal pad is soldered directly to heat spreader substrate 82. Cylindrical magnet 88 is provided in the center of the resulting assembly of LED units 86, by cementing magnet 88 at that location directly to the PCB 84. Ring 90 is cemented to heat spreader substrate 82, in a position so that the resulting hexagonal pattern of single die LED units 86 is centered in relation to and concentric with the inner wall of ring 90. Protective lens 92 is also cemented to the top of ring 90.

Figure 7:
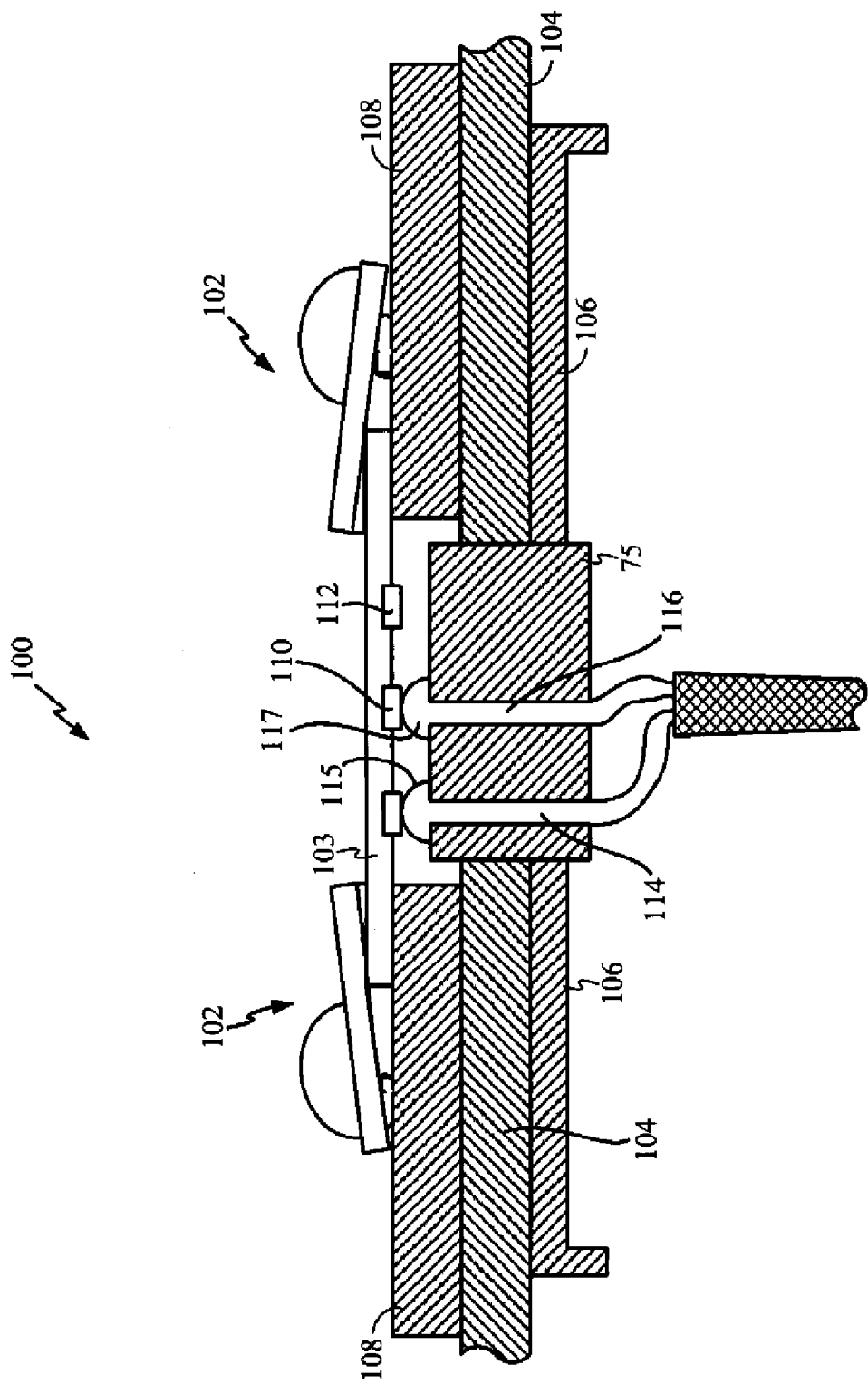
FIG. 7 is an elevated side cross-sectional view of portions of the LED assembly shown in FIG. 5.
Figure 8:
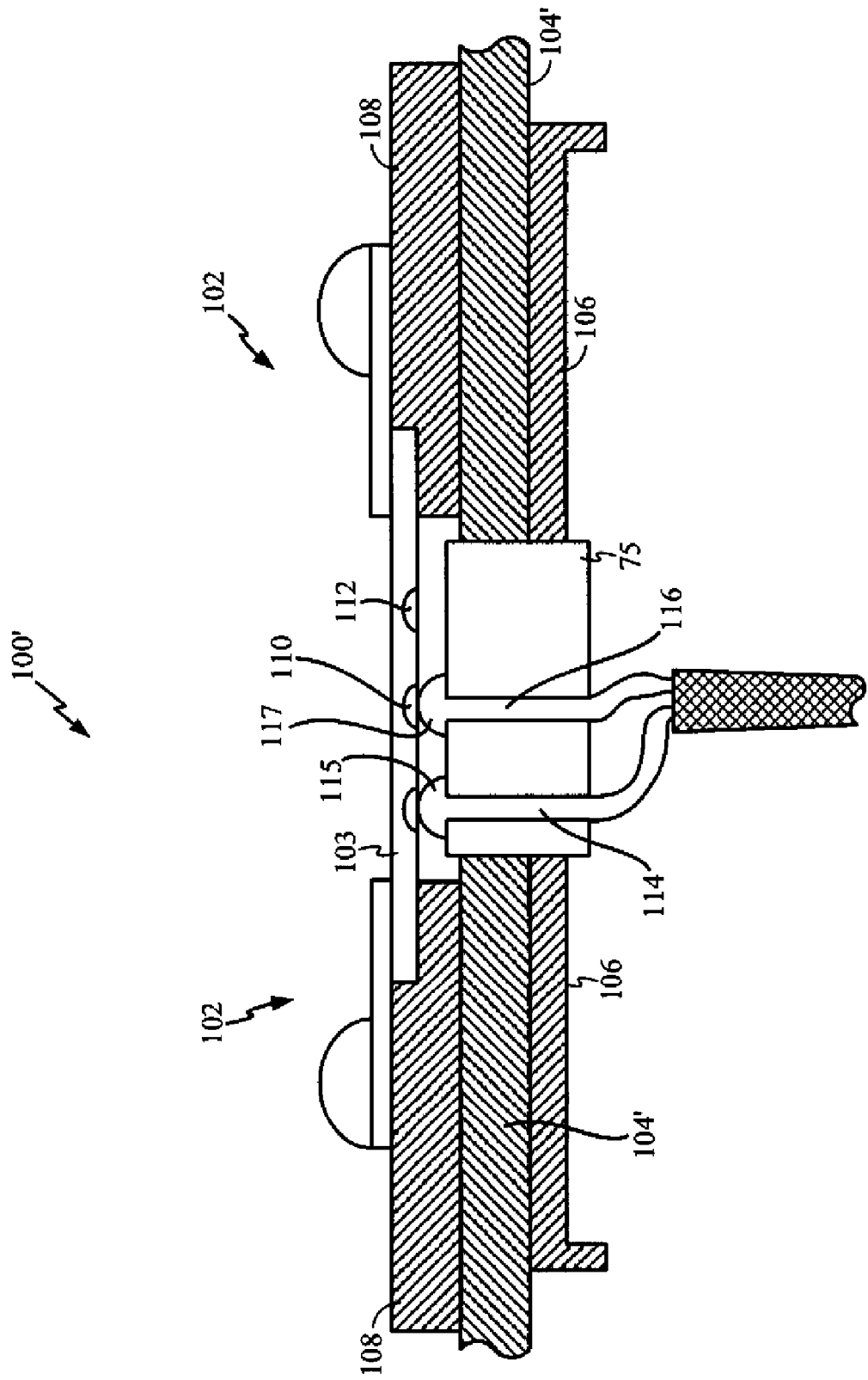
FIG. 8 is an elevated side cross-sectional view of the same portions of the LED assembly shown in FIG. 7, per a different embodiment.

FIG. 7 and FIG. 8 show variations of cross-sectional portions of an LED assembly as shown in FIG. 5. One version of the illustrated cross-section 100 is shown in FIG. 7, and another version 100' is shown in FIG. 8.

As shown, for example, in FIG. 6, a given LED module 80 may include six LEDs evenly spaced in a round table fashion about a center axis. Different positioning and directional configurations of the single die LEDs could be employed in an LED module in accordance with other embodiments. In addition, the number of single die LED units that are employed could be just one LED, or a plural number of LEDs that is different than the number of LEDs shown in the embodiments herein.

For purpose of simplification, the assembly shown in FIG. 7 only shows two single die LED units 102. Those LED units 102 are connected using solder reflow to a flex circuit type PCB 103 as well as to a heat spreader substrate 108. More specifically, each of the LED units 102 has anode and cathode connection pads on the bottom surface thereof and a thermal pad on their bottom surface. The thermal pads are soldered directly to the top surface of heat spreader substrate 108, while the anode and cathode pads are soldered directly to corresponding conductive pads on PCB 103.

It should be noted that in lieu of solder, other thermal connection methods and substances may be employed to connect the heat sink interface of a given LED unit and the interfacing portion of the heat sink structure. For example, thermal epoxy or thermal tape could be employed.

Accordingly, the thermal pads of each of the LED units 102, which comprise the heat sink interface of those LED units, are connected directly to an interfacing portion (heat spreader substrate 108) of a heat sink structure. The portions of the heat sink interface of LED units 102 that is so connected to heat spreader substrate 108 happens to be the entire thermal pad of each LED unit 102. It is important that the interfacing portion of the heat sink structure (i.e., the heat spreader substrate 108 in this embodiment) is directly in touching contact with the majority of the heat transfer area of the heat sink interface. This "majority" of the heat transfer area, in this embodiment, includes all of the thermal pad which is the heat transfer area of the illustrated LED units 102. The cathode, anode, and thermal pads of each of the respective LED units 102, in this specific embodiment, will be described further hereinbelow.

PCB 103 includes a conductive pattern, portions of which include, as shown in FIG. 7, a certain conductive pattern including exposed pads on the underneath side of PCB 103. Those conductive portions include a center pad 110 centered on the under side portion of PCB 103, and an annular pad 112, which surrounds center pad 110 and is concentric with center pad 110.

As shown in FIGS. 7 and 8, heat spreader substrate 108, to which LED units 102 (and other structure (not shown in this figures) including a ring and an LED protective lens) are collectively fixed, is in contact with the flat surface of base end 104 of the cup-shaped LED support 70, for example, as shown in FIG. 5. FIGS. 7 and 8 also show a side cross-sectional view of portions of a ferrous ring member 106, that was secured to the inside of base end 104, because the cup-shaped LED support (including base end 104) is made, in this illustrated embodiment, of non-ferrous aluminum. Accordingly, by providing a ferrous ring member 106, when the LED module 61 (which includes the assembly mounted on heat spread substrate 108) is magnetic, the magnetic force can act upon ferrous ring member 106 to bring heat spreader substrate 108 into secure contact with the outer surface of base end 104 of the cup-shaped LED support.

When this secure connection happens, an insulative plug 75 is protruding upwardly through an opening in base end 104 will hold the heads 115 and 117 of first pin 114 and second pin 116 in direct contact with annular pad 112 and center pad 110, thereby causing an electrical connection between wires coupled to first and second pins 114 and 116 and the corresponding anodes and electrodes of the set of LED units 102, by way of the conductive patterns in PCB 103. The wires coupled to first and second pins 114 and 116 are connected to a current source that drives LED units 102.

Per the embodiment shown in FIG. 7, PCB 103 (which in the embodiment is a flex circuit of a thickness equal to approximately 1 mm) is simply placed on and overlaps with the cylindrical opening of heat spreader substrate 108. Thus, it is slightly raised in relation to the surface of heat spreader substrate 108. Thus, when LED units 102 are connected to PCB 103 (at the anode and cathode pads thereof) and directly to heat spreader substrate 108 (at the thermal pads thereof), they tilt at an angle of approximately one degree.

FIG. 8 shows an embodiment in which the tilting of LEDs 102 is not necessary. The tilting of LEDs 102 is prevented by mounting PCB 103 within a recessed portion of heat spreader substrate 108.

Figure 9:
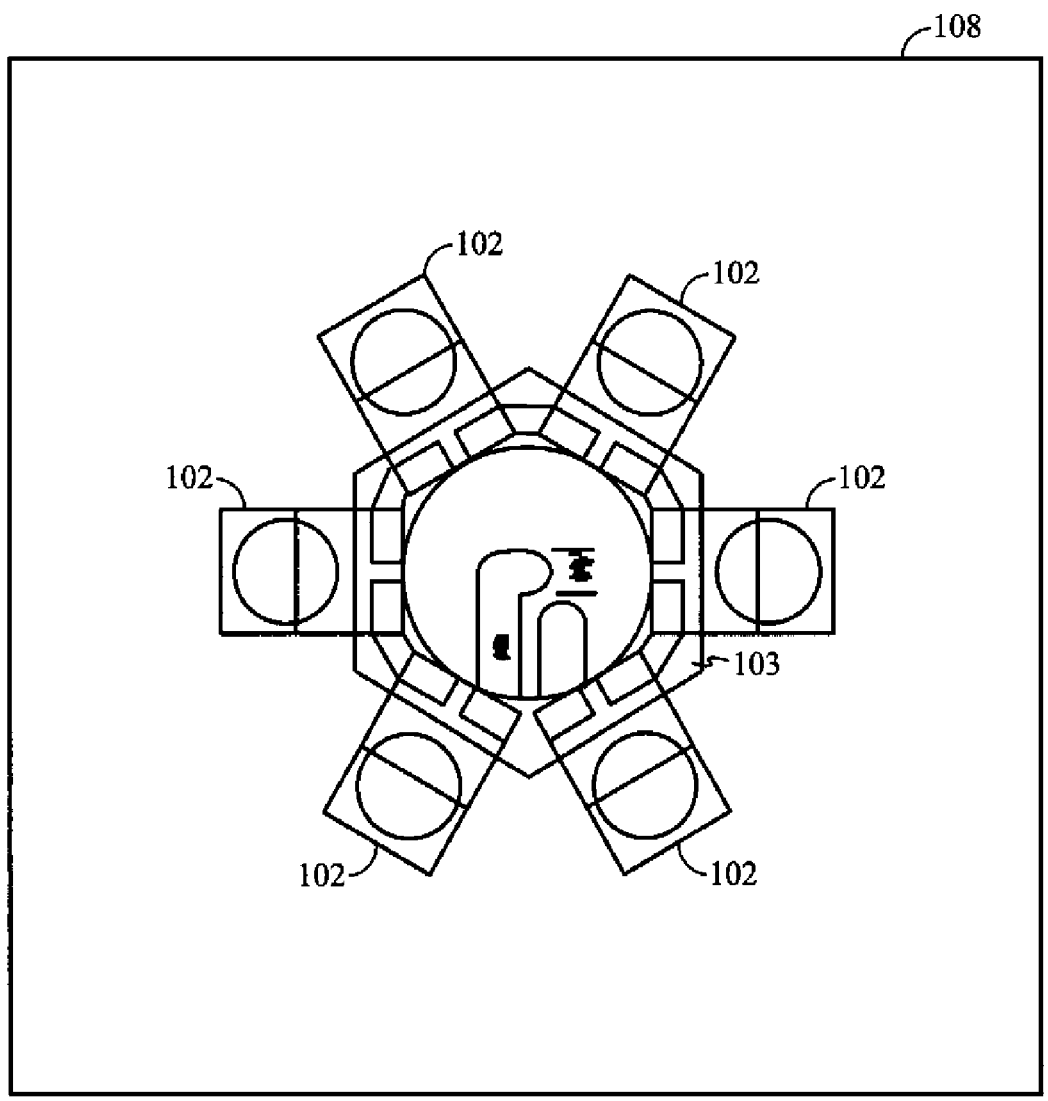
FIG. 9 is a top view of a plural set of LED modules interconnected with a printed circuit board and a heat spreader substrate.

FIG. 9 shows a top view of heat spreader substrate 108 shown in FIG. 8, and of six individual LED units 102. LED units 102 are connected using solder reflow to pads underneath the same. Those pads to which LEDs 102 are connected on the PCB include surface contact pads on the PCB 103.

Figure 10:
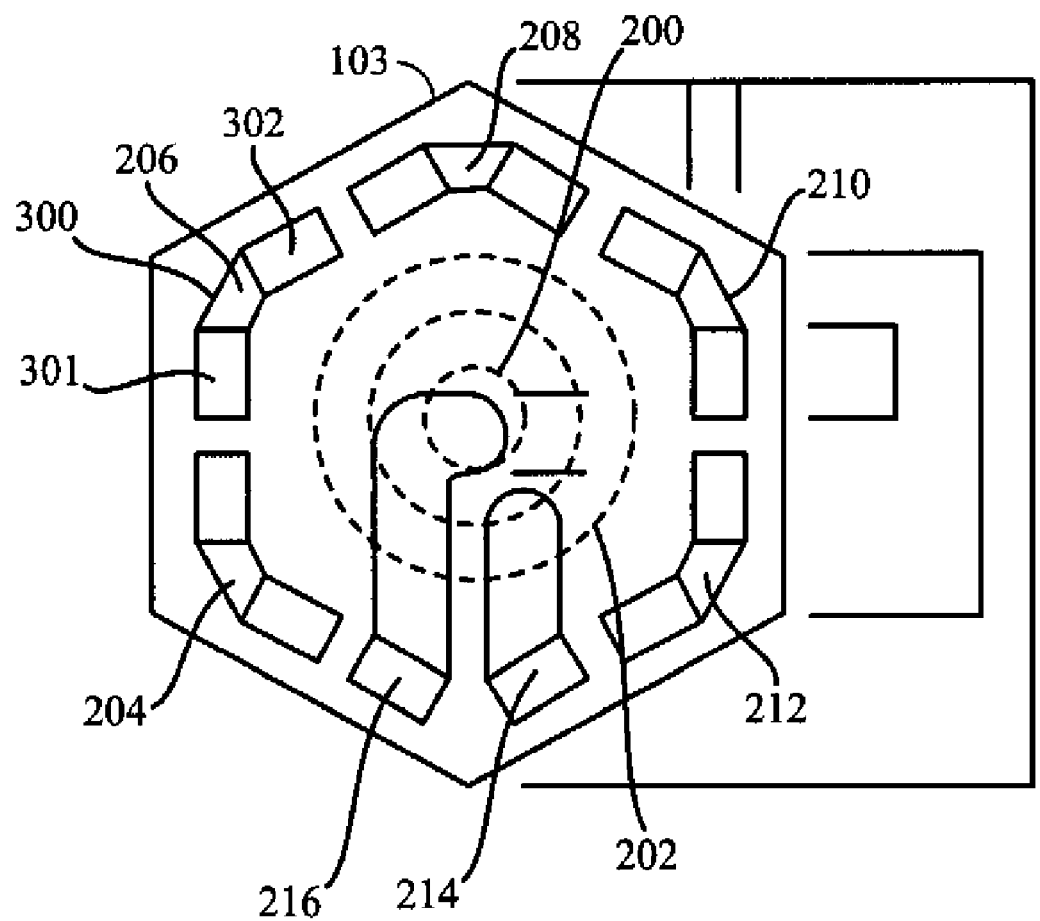
FIG. 10 is a top view of a flex circuit in accordance with one embodiment of the present disclosure.

FIG. 10 provides a top view of PCB 103 in accordance with one embodiment. The conductive pattern includes a lower conductive pattern (which includes center pad 200 and annular pad 202), and a top layer conductive pattern including seven conductive portions. Those seven conductive portions include conductive portions 204, 206, 208, 210, 212, 214, and 216. Each of those upper conductive portions 206, 208, 210, 212, 214, and 216 includes one or more surface contact pads. For example, conductive portion 206 includes a conductive portion 300 that is not accessible via the surface as well as surface accessible conductive pads 301 and 302. These surface accessible conductive pads are areas to which the anode and cathode conductive pads of one of the LEDs 102 are connected. The LEDs are connected to these pads and other similar pads in order to form a daisy chain/series connection between the LEDs.

Figure 11:
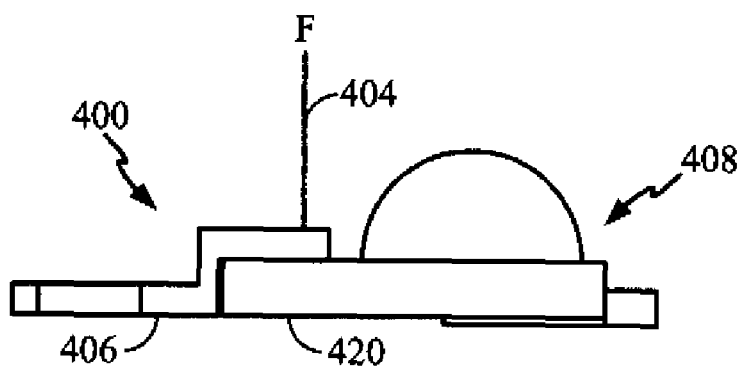
FIGS. 11, 12, and 13 respectively show a cross section, a top view, and a side view of a socket cover structure.
Figure 12:
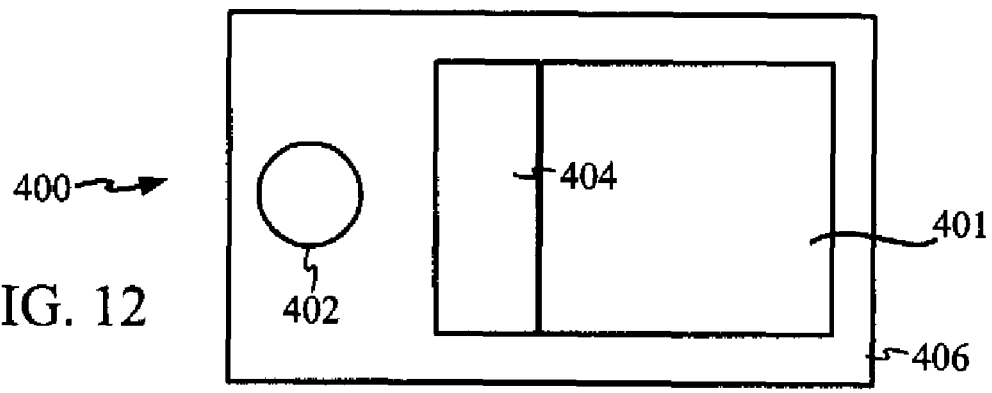
Figure 13:
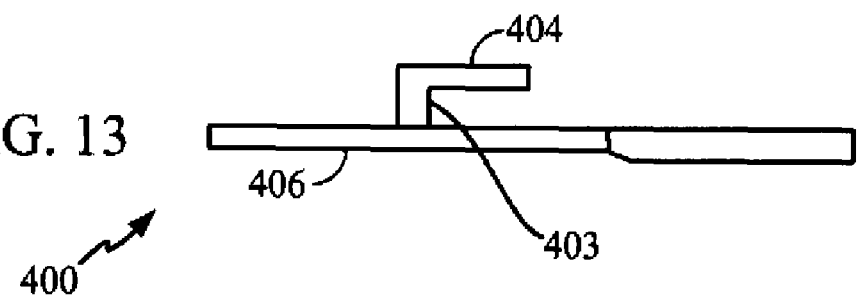

Each of FIGS. 11, 12, and 13 show different views of a socket cover structure in accordance with one embodiment.

The illustrated socket cover 400 includes a base 406 and a resilient biasing member. As visible from the cross section view in FIG. 11 and the side view in FIG. 13, resilient biasing member may be integrally formed and unitary with the enter socket cover structure, and may supported by a vertical member 403. Socket cover structure further includes a major opening 401, to allow for a bubble-shaped. LED lens of a given LED unit 408 to be secured by the resulting socket (which is formed when socket cover structure is securely mounted to some sort of base structure).

The base structure to which a socket cover structure can be secured can include a PCB or a flex circuit. It can also be secured to a heat sink or a portion of a heat sink, e.g., a metallic or ceramic planar member, at least at portions. For example, a screw hole 402 may be provided, to allow socket cover structure to be screwed to a base, including a metal heat sink or heat spreader member.

As shown in FIG. 11, the resilient biasing member 404 has a curved lip end which serves to create an apex point of the resilient biasing force—identified by the arrow labeled "F". In this embodiment, this apex point of the biasing force causes pressure to be concentrated at a point on or near the edge of the anode and cathode pads 420 of LED unit 408.

The socket created by mounting the socket cover structure shown in FIGS. 11-13 is intended for use with high power, high priced LEDs needing heat dissipation and replacement. A problem exists with LEDs of this sort. There is a need for a simple inexpensive way to use and replace basic high power LEDs. High power LEDs need to transfer heat away from their die to maintain maximum efficiency and life. Because the high power LED needs to be connected to a heat dissipating device, the current state of the art is to solder one or more LEDs on modules that provide electrical and heat transfer functions. This module can provide all the heat dissipation or be attached to another device to dissipate heat. If one LED should burn out the whole module needs to be replaced.

This embodiment makes it possible to easily change individual LEDs by replacing the method of permanently soldering an LED to a module with an LED socket where the LED is attached to circuitry and heat dissipater.

A socket may be formed with the disclosed structure or variations thereof, thereby creating a socket that: secures and positions the LED; provides pressure to hold the LED to the heat dissipater; allows option of inexpensive power connection via flex circuit edge connector; allows option of having the LED heat pad connected directly to the heat dissipating equipment instead of via a circuit module (as in the current state of the art and described in the Lumileds Rebel application notes); and/or allows screw, clip, etc., reflow attachment to heatsinks and circuits.

A socket may be made from a thin flex circuit and a cover (e.g., as shown in FIGS. 11-13) that secures and positions the LED. The resulting socket may be placed directly on a heat dissipater. The cover may position the LED on the circuit leads and applies pressure to hold the LED to the electrical contacts and the LED heat pad to the heat dissipater. Thermal grease, tape, etc. could be used to decrease the thermal resistance of the socket. The cover could be formed from metal clip, spring, plastic, etc.

Alternatively, a socket may be made with a circuit made from a thicker circuit board material and embedded into the heat dissipater so that when the LED is inserted into the socket, it's heat pad impinges directly on the heat dissipater.

Alternatively, the socket is connected to a PCB, MCB, etc. This module/fixture may be connected to or contains a heat dissipater.

Alternatively, the heat dissipater could be directly applied to the LED heat pad. The LED with heat dissipater permanently (or otherwise) attached would then be inserted into a socket.

Alternatively, an intermediary heat transfer piece could be applied to the LED heat pad. When the LED is inserted into the socket the heat transfer piece would directly contact the heat dissipater.

Alternatively, the heat dissipater or heat transfer piece could be directly manufactured into the LED as part of its heat pad and this would then be inserted into the socket.

The cover and/or circuit could be attached to circuit and/or heat dissipater using surface mount, screw down, form fit insert, etc.

The socket could be used for a single LED or multiple sockets could be stamped or molded into one unit. Since most LED drivers provide a constant current, this multiple socket version could use inserts that jumper unused sockets. For example a 6 socket unit could have 1 or more sockets jumper out if not needed.

Advantages of providing a socket include a reduction in production costs. Such a reduction would occur for manufacturers. Eliminating the inclusion of expensive LEDs into modules/fixtures (LEDs can account for 90% or more of an LED module's cost. The end user can decide what LEDs to use at point of sale. The socket can eliminate need for intermediary LED modules. Sockets could be added straight to the supporting structure (for example the case of an appliance if it can dissipate necessary heat). Sockets can eliminates multiple versions of modules for different types of LED light (for example warm, neutral, cool LED white light, etc.). An LED module/fixture manufacturer can make and inventory one version of the module/fixture instead of having a version for each type of LED that end users may need (lumen level, color temperature, etc). For warm, neutral, and cool white colors of light at three lumen levels, the manufacturer would have to produce 9 different versions of a module vs. one with the use of sockets.

Sockets can reduces cost of inventory obsolescence based on outdated modules/fixtures because they no longer contain expensive LEDs and because one version of module instead of multiple. They can reduce the cost of inventory obsolescence based on out dated LEDs for same reasons. They can also enable the use of inexpensive FR4 boards for socket circuit providing quick prototyping. They are easy to replace.

The smallest denominator of light gives the greatest flexibility in design. The use of sockets results in a more efficient heat transfer path—LED heat pad can be connected directly to heat sink (though thermal compound) or indirectly through one other media, state of the art and documented in Rebel application notes transfer heat thru 3 materials before reaching the heat sink.

For a socket on a heatsink, the LED heat pad may be connected directly to heatsink and indirectly thru thermal compound.

For a socketed LED on FR4 PCB module and connected to a heatsink, The following steps may be performed. The LED heat pad may be soldered. Solder may be applied to copper on one side of PCB, and then thru-plated vias to opposite side of PCB to copper heat transfer area. Copper may be applied directly to the heatsink and indirectly through thermal compound.

The LED may be separated from the module or fixture, to thereby reduce the inventory needed at each level of distribution from manufacturer to end user.

Distributors and retailers likewise would only have to inventory one version of the module or fixture instead of one for each type of LED. The module/fixture is many times bigger than the individual LEDS saving space. The individual LEDs can be used in multiple fixtures from multiple vendors.

End users would have more options. End users can decide at the retail outlet what type of light they need in the fixture. For example, warm white LED in one application and neutral in another. If the end user can not afford or does not need a high lumen LED version they can opt for a lower cost lower lumen version.

Outdated module/fixture inventory is more valuable because LED failures no longer make the module/fixture obsolescent.

End users would not be dependent on the original module/fixture manufacturer if LED failure occurs. Very large users of LED products, for example, militaries which could have thousands of different kinds of modules/fixtures, could operate more efficiently by carrying less numbers of replacements for each type of module/fixture they use in case of LED failures. They would carry just the LEDs instead for this type of failure, reducing cost of inventory, and cost of logistics.

The use of sockets would result in the more efficient use of resources, and reduces cost for the end user. When an LED fails, the user need only replace the LED and not the entire fixture/module.

The claims as originally presented and as they may be amended, encompass variations, alternatives, modifications, improvements, equivalents and substantial equivalents of the embodiments and teachings disclosed herein, including those that are presently unforeseen or unappreciated, and that, for example, may arise from applicants/patentees and others.

What is claimed is:

1. Apparatus comprising:
a high power light emitting diode (LED) unit including at least one LED die, including at least one first lead and at least one second lead, and including a heat sink interface;
at least one printed circuit board including a conductive pattern configured to connect both the at least one first lead and the at least one second lead to a current source; and
an interfacing portion of a heat sink structure through which a majority of heat of the heat sink interface is transmitted, the interfacing portion being directly in touching contact with a majority of heat transfer area of the heat sink interface;
where the heat sink interface is electrically isolated from both the at least one first lead and the at least one second lead, and
wherein the heat sink interface includes a metal substrate connected directly to the LED die via a low thermal resistance connection.

2. The apparatus according to claim 1, where the at least one printed circuit board includes a flex circuit.

3. The apparatus according to claim 1, wherein the at least one printed circuit board includes a single layer flex circuit.

4. The apparatus according to claim 1, wherein the interfacing portion of the heat sink structure includes a heat spreader.

5. The apparatus according to claim 1, wherein the interfacing portion of the heat sink structure includes a metallic structure.

6. The apparatus according to claim 1, wherein the majority of heat transfer area includes all of the heat transfer area of the heat sink interface.

7. The apparatus according to claim 1, wherein the interfacing portion is directly in touching contact with the heat transfer area of the heat sink interface via thermal epoxy.

8. Apparatus comprising:
a high power light emitting diode (LED) unit including at least one LED die, including at least one first lead and at least one second lead, and including a heat sink interface;
at least one printed circuit board including a conductive pattern configured to connect both the at least one first lead and the at least one second lead to a current source; and
an interfacing portion of a heat sink structure through which a majority of heat of the heat sink interface is transmitted, the interfacing portion being directly in touching contact with a majority of heat transfer area of the heat sink interface;
wherein the heat sink interface includes a thermal pad of a surface mount amount LED.

9. Apparatus comprising:
a high power light emitting diode (LED) unit including at least one LED die, including at least one first lead and at least one second lead, and including a heat sink interface;
at least one printed circuit board including a conductive pattern configured to connect both the at least one first lead and the at least one second lead to a current source; and
an interfacing portion of a heat sink structure through which a majority of heat of the heat sink interface is transmitted, the interfacing portion being directly in touching contact with a majority of heat transfer area of the heat sink interface;
wherein the interfacing portion of the heat sink structure includes a tinned aluminum plate.

10. Apparatus comprising:
a high power light emitting diode (LED) unit including at least one LED die, including at least one first lead and at least one second lead, and including a heat sink interface;
at least one printed circuit board including a conductive pattern configured to connect both the at least one first lead and the at least one second lead to a current source; and
an interfacing portion of a heat sink structure through which a majority of heat of the heat sink interface is transmitted, the interfacing portion being directly in touching contact with a majority of heat transfer area of the heat sink interface;
where the heat sink interface is electrically isolated from both the at least one first lead and the at least one second lead, and
wherein the interfacing portion is directly in touching contact with the majority of heat transfer area of the heat sink interface via a reflow solder connection.

11. Apparatus comprising:
a high power light emitting diode (LED) unit including at least one LED die, including at least one first lead and at least one second lead, and including a heat sink interface;
at least one printed circuit board including a conductive pattern configured to connect both the at least one first lead and the at least one second lead to a current source; and
an interfacing portion of a heat sink structure through which a majority of heat of the heat sink interface is transmitted, the interfacing portion being directly in touching contact with a majority of heat transfer area of the heat sink interface;

where the heat sink interface is electrically isolated from both the at least one first lead and the at least one second lead, and wherein the interfacing portion is directly in touching contact with the majority of a heat transfer area of the heat sink interface via thermal tape.

12. Apparatus comprising:
a high power light emitting diode (LED) unit including at least one LED die, including at least one first lead and at least one second lead, and including a heat sink interface;

at least one printed circuit board including a conductive pattern configured to connect both the at least one first lead and the at least one second lead to a current source;

an interfacing portion of a heat sink structure through which a majority of heat of the heat sink interface is transmitted, the interfacing portion being directly in touching contact with a majority of heat transfer area of the heat sink interface; and a biaser configured to resiliently apply a biasing force causing the interfacing portion and the heat transfer area of the heat sink interface to be forced with continuous pressure to remain in touching contact with each other.

13. The apparatus according to claim 12, wherein the biaser includes a spring clip.

14. The apparatus according claim 13, wherein the biaser includes a plug-in receptacle including a spring configured to receive the LED unit, whereby once the LED unit is so received, the biasing force is automatically and continuously applied.

* * * * *